(12) United States Patent
Shirakata et al.

(10) Patent No.: US 9,812,929 B2
(45) Date of Patent: Nov. 7, 2017

(54) ELECTRIC ROTATING MACHINE

(75) Inventors: Yuji Shirakata, Chiyoda-ku (JP); Dai Nakajima, Chiyoda-ku (JP); Masahiko Fujita, Chiyoda-ku (JP); Masaki Kato, Chiyoda-ku (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 382 days.

(21) Appl. No.: 14/372,493

(22) PCT Filed: Apr. 16, 2012

(86) PCT No.: PCT/JP2012/060219
§ 371 (c)(1),
(2), (4) Date: Jul. 16, 2014

(87) PCT Pub. No.: WO2013/157065
PCT Pub. Date: Oct. 24, 2013

(65) Prior Publication Data
US 2014/0361648 A1    Dec. 11, 2014

(51) Int. Cl.
*H02K 9/00*    (2006.01)
*H02K 11/04*    (2016.01)
(Continued)

(52) U.S. Cl.
CPC .............. *H02K 9/00* (2013.01); *H02K 11/046* (2013.01); *H02K 11/048* (2013.01); *H02K 11/05* (2016.01);
(Continued)

(58) Field of Classification Search
CPC ...... H02K 11/046; H02K 11/073; H02K 9/19; H02K 9/16; H02K 9/02; H02K 5/18; H02K 11/04; H02K 7/00; H02K 11/02
See application file for complete search history.

(56) References Cited

U.S. PATENT DOCUMENTS 7,932,649 B2 *   4/2011   Dubuc ................. H02K 11/048
                                                          310/68 D
2007/0103101 A1  5/2007   Kikuchi et al.
(Continued)

FOREIGN PATENT DOCUMENTS

CN        1906826 A        1/2007
CN      102263071 A       11/2011
(Continued)

OTHER PUBLICATIONS

International Search Report of PCT/JP2012/060219, dated Jul. 10, 2012.
(Continued)

Primary Examiner — Joshua Benitez Rosario
Assistant Examiner — Leda Pham
(74) Attorney, Agent, or Firm — Sughrue Mion, PLLC; Richard C. Turner

(57) ABSTRACT

Two or more switching devices (36) and two or more lead frames (41, 42, 43, and 44) are integrally molded by use of a molding resin (37) so that a power module (30) is formed; the power module (30) is made to adhere to a heat sink (32) via an insulating material (31); the power module (30) and the heat sink (32) are fixed to a housing (33) of the power module composite (23); the power module composite (23) is fixed to a case (6) of an electric rotating machine (1) via the housing (33).

11 Claims, 5 Drawing Sheets

(51) Int. Cl.
*H02P 27/06* (2006.01)
*H02K 11/05* (2016.01)
*H02K 5/08* (2006.01)
*H02K 5/14* (2006.01)
*H02K 5/22* (2006.01)
*H02K 15/12* (2006.01)
*H02K 11/33* (2016.01)

(52) U.S. Cl.
CPC ............. *H02P 27/06* (2013.01); *H02K 5/08* (2013.01); *H02K 5/141* (2013.01); *H02K 5/225* (2013.01); *H02K 11/33* (2016.01); *H02K 15/12* (2013.01)

(56) References Cited

U.S. PATENT DOCUMENTS

| | | | |
|---|---|---|---|
| 2008/0211331 | A1 | 9/2008 | Dubuc et al. |
| 2010/0052481 | A1* | 3/2010 | Oohashi ................. H02K 5/141 310/68 D |
| 2010/0097053 | A1* | 4/2010 | Kikuchi ............... H02K 11/225 324/207.25 |
| 2011/0101804 | A1* | 5/2011 | Isoda ....................... H02K 5/18 310/64 |
| 2011/0175496 | A1 | 7/2011 | Shirakata et al. |
| 2011/0254411 | A1 | 10/2011 | Minato |

FOREIGN PATENT DOCUMENTS

| | | |
|---|---|---|
| JP | 2008-136273 A | 6/2008 |
| JP | 2008-543266 A | 11/2008 |
| JP | 2009-17751 A | 1/2009 |
| JP | 2011-147319 A | 7/2011 |

OTHER PUBLICATIONS

Communication dated Feb. 5, 2016, issued by the European Patent Office in corresponding European Application No. 12874808.4.
Communication dated Dec. 28, 2015, issued by the State Intellectual Property Office of the P.R.C. in corresponding Chinese Application No. 201280070927.1.
Communication dated Mar. 31, 2015 from the Japanese Patent Office in counterpart Application No. 2014-510979.
Communication dated Aug. 5, 2016, issued by the State Intellectual Property Office of the P.R.C. in corresponding Chinese Application No. 201280070927.1.
Communication dated Jan. 20, 2017, issued by the State Intellectual Property Office of the P.R.C. issued in corresponding Chinese Application No. 201280070927.1.
Communication dated Jun. 14, 2017, from the State Intellectual Property Office of the P.R.C. in counterpart Chinese application No. 201280070927.1.

* cited by examiner

ELECTRIC ROTATING MACHINE

CROSS REFERENCE TO RELATED APPLICATIONS

This application is a National Stage of International Application No. PCT/JP2012/060219 filed Apr. 16, 2012, the contents of all of which are incorporated herein by reference in their entirety.

TECHNICAL FIELD

The present invention relates to an electric rotating machine in which a control apparatus for controlling the electric rotating machine is mounted.

BACKGROUND ART

To date, an electric rotating machine in the main body of which a control apparatus for controlling the electric rotating machine is mounted has been well known. The control apparatus in a conventional electric rotating machine is disposed on a rear bracket of the main body of the electric rotating machine; the control apparatus is provided with an electric-power conversion circuit unit that performs electric power conversion between DC power and AC power, a magnetic-field circuit unit that supplies a magnetic-field current to a magnetic-field winding of the electric rotating machine, and a control circuit unit that controls the electric-power conversion circuit unit and the magnetic-field circuit unit.

For example, an electric rotating machine disclosed in Patent Document 1 is provided with a control apparatus disposed on the axis-direction endface of a rear bracket. The control apparatus is provided with a first power module in which a plurality of switching devices included in the upper arm of an electric-power conversion circuit are modularized, a first heat sink on which the first power module is mounted and that is connected with the positive-polarity terminal of a battery, a second power module in which a plurality of switching devices included in the lower arm of the electric-power conversion circuit are modularized, a second heat sink on which the second power module is mounted, a wiring board connected with the negative-polarity electrodes of a plurality of switching devices included in the upper arm, and a relay member connected between the wiring board and a stator lead, which is a terminal portion of an armature winding of the electric rotating machine.

A conventional electric rotating machine disclosed in Patent Document 2 is provided with a control apparatus disposed on the axis-direction endface of a rear bracket. The control apparatus is provided with respective modules for corresponding phases of the stator, in each of which a pair of switching devices included in the upper arm and the lower arm for the corresponding phase are sealed with a resin. Each of these modules is configured in such a way that the lead frame thereof is exposed at the side thereof facing a heat sink, and is fixed through an insulating material to a protrusion portion formed on the surface of the heat sink fixed to the rear bracket.

PRIOR ART REFERENCE

Patent Document

[Patent Document 1] National Publication of International Patent Application No. 2008-136273

[Patent Document 2] National Publication of International Patent Application No. 2011-147319

DISCLOSURE OF THE INVENTION

Problem(s) to be Solved by the Invention

As is well known, because an electric rotating machine mounted in a room where the internal combustion engine of a vehicle is provided is disposed in a limited space, it is an indispensable condition in terms of the configuration thereof that the electric rotating machine is downsized. Accordingly, in the case where as the foregoing conventional electric rotating machine, the upper and lower arms, for each phase, of an inverter are configured with respective separate modules, not only the projected area necessary for mounting each module on a bracket included in a case of the electric rotating machine but also the number of the modules to be mounted on the bracket increases; thus, a problem has been posed that the number of man-hours at a time when each module is mounted increases.

In the case where as the foregoing conventional electric rotating machine, a heat sink is connected with the positive electrode of a battery and has the positive-electrode electric potential of the battery, it is required to secure the creepage distances among the heat sink, a bracket included in the housing of the electric rotating machine, and other components; therefore, the shape and size of the heat sink are restricted; furthermore, because the heat sink has the foregoing electric potential, a problem has been posed that it is required to take countermeasures for the electrolytic corrosion of the heat sink.

Moreover, in the case where the heat sink on which the foregoing modules are mounted is fixed to the bracket in such a way as to make contact therewith, heat is readily transferred from the stator to the heat sink through the bracket and hence the temperature of the heat sink rises; as a result, for example, a problem has been posed that the temperature of the switching device provided in the module rises, thereby providing an adverse effect to the switching device.

The present invention has been implemented in order to solve the foregoing problems in a conventional electric rotating machine; the objective thereof is to obtain an electric rotating machine provided with an easy-assembly and high-reliability control apparatus.

Means for Solving the Problems

An electric rotating machine according to the present invention is provided with a rotor fixed on the rotor shaft, a stator that is disposed in such a way as to face the rotor and is provided with a stator winding, a case that pivotably supports the rotor shaft and holds the stator, and a control apparatus that is fixed to the case and has a power module composite provided with an electric-power conversion circuit that performs electric-power conversion between the stator winding and an external DC power source and a control apparatus having a control circuit unit that controls the electric-power conversion circuit; the electric rotating machine is characterized in that the electric-power conversion circuit provided in the power module composite is controlled by the control circuit unit so as to convert DC power from an external DC power source into AC power and supply the AC power to the stator winding or so as to convert AC power generated across the stator winding into DC power and supply the DC power to the DC power source, in that the power module composite includes a power module provided with switching devices included in the electric-power conversion circuit, a housing containing the power module, and a heat sink that is fixed to the housing and refrigerates the power module, in that the power module includes a first lead frame connected with a first electrode of the switching device, a second lead frame connected with a second electrode of the switching device, a third lead frame connected with a third electrode of the switching device, and a molding resin for integrally molding the first lead frame, the second lead frame, and the third lead frame and for insulating the first lead frame, the second lead frame, and the third lead frame from one another, and in that the heat sink adheres to the power module via an insulating material.

Advantage of the Invention

In an electric rotating machine according to the present invention, the power module composite includes a power module provided with switching devices included in the electric-power conversion circuit, a housing containing the power module, and a heat sink that is fixed to the housing and refrigerates the power module; the power module includes a first lead frame connected with a first electrode of the switching device, a second lead frame connected with a second electrode of the switching device, a third lead frame connected with a third electrode of the switching device, and a molding resin for integrally molding the first lead frame, the second lead frame, and the third lead frame and for insulating the first lead frame, the second lead frame, and the third lead frame from one another; and the heat sink adheres to the power module via an insulating material. Therefore, it made possible to obtain an electric rotating machine provided with a high-reliability control apparatus that can readily be assembled and does not require conventional measures for electrolytic corrosion of the heat sink.

BEST MODE FOR CARRYING OUT THE INVENTION

Embodiment 1

Figure 1:
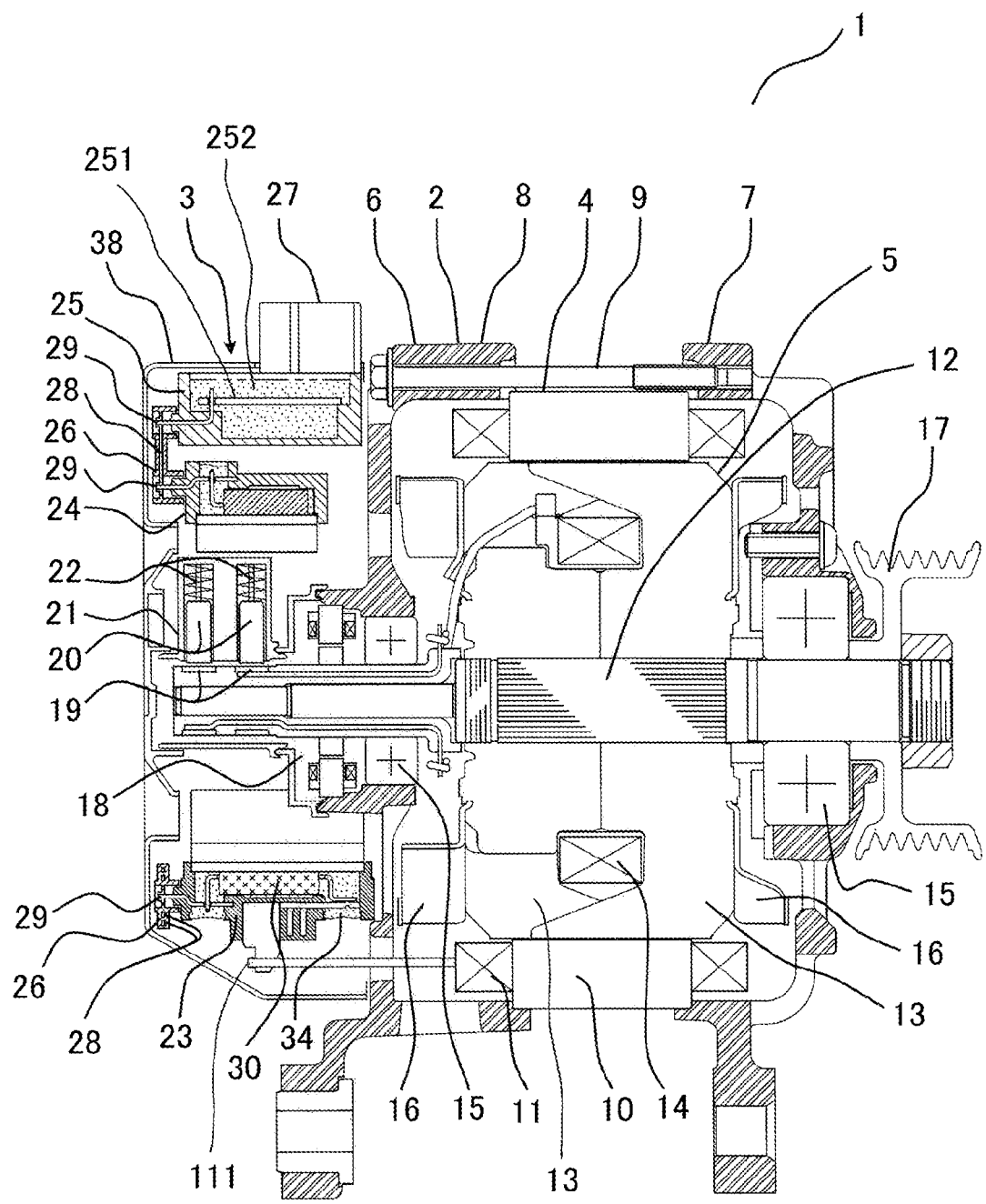
FIG. 1 is a cross-sectional view of an electric rotating machine according to Embodiment 1 of the present invention, illustrating the cross section thereof, taken along the line A-A in FIG. 2, at a time when the electric rotating machine is viewed along the arrows.
Figure 2:
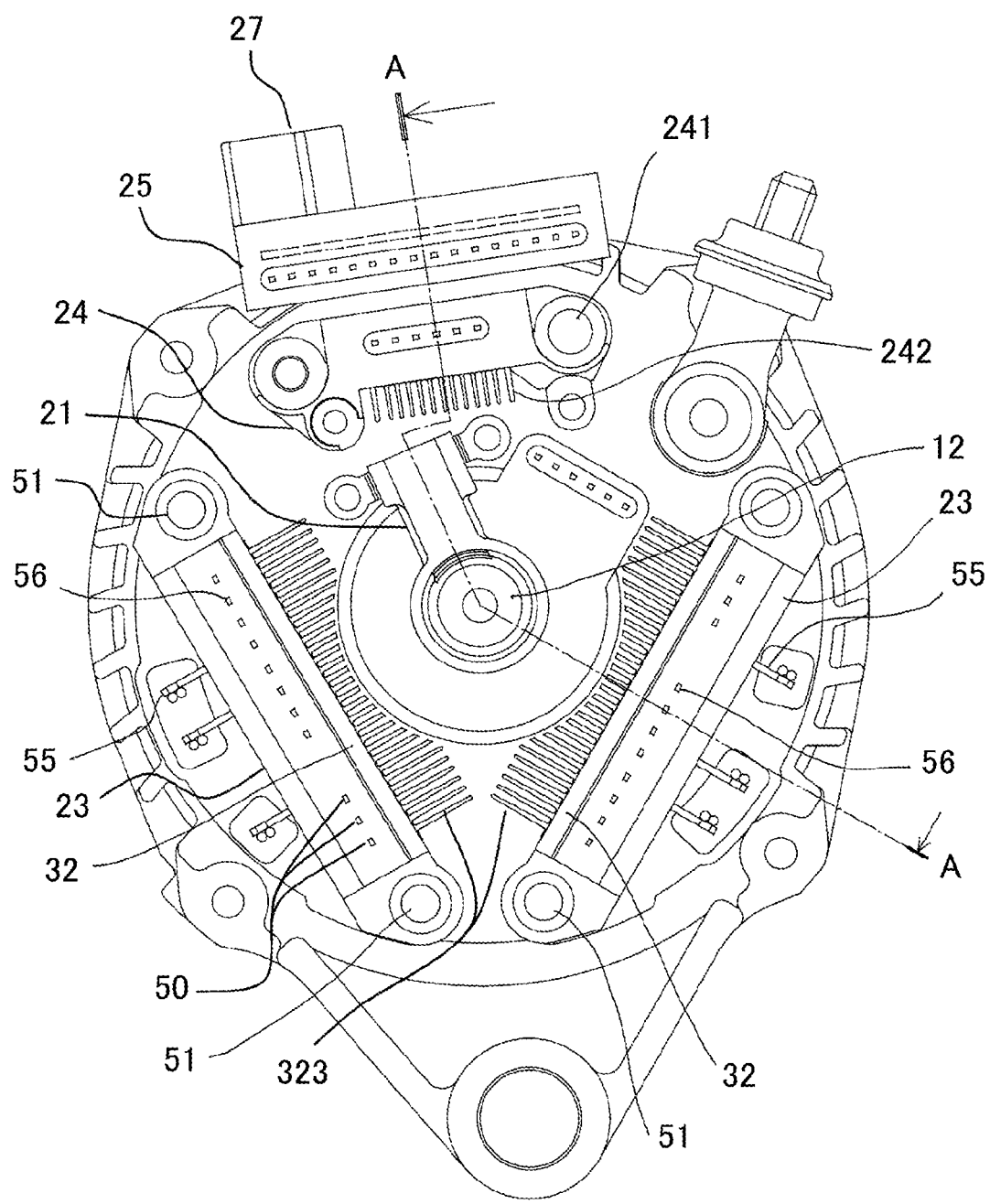
FIG. 2 is an elevation view of the electric rotating machine according to Embodiment 1 of the present invention, illustrating the electric rotating machine at a time when the cover of a control apparatus is removed.

Hereinafter, an electric rotating machine according to Embodiment 1 of the present invention will be explained in detail with reference to the drawings. FIG. 1 is a cross-sectional view of an electric rotating machine according to Embodiment 1 of the present invention, illustrating the cross section thereof, taken along the line A-A in FIG. 2, at a time when the electric rotating machine is viewed along the arrows. FIG. 2 is an elevation view of the electric rotating machine according to Embodiment 1 of the present invention, illustrating the electric rotating machine at a time when the cover of a control apparatus is removed. In FIGS. 1 and 2, an electric rotating machine 1 is a controller-integrated electric rotating machine having an electric rotating machine main body 2 and a control apparatus 3 mounted on the electric rotating machine main body 2; for example, the electric rotating machine 1 is mounted in a vehicle that is driven by an internal combustion engine. In Embodiment 1, the electric rotating machine 1 is formed as an AC motor generator having a brush. In the following description, the explanation will be made with reference to the drawings, in each of which the same or similar constituent members and elements are designated by the same reference numerals.

The electric rotating machine main body 2 has a cylindrical stator 4, a rotor 5 that is disposed in the inner space of the stator 4 and is rotatable with respect to the stator 4, and a case 6 that supports the stator 4 and the rotor 5. The case 6 has a front bracket 7 and a rear bracket 8 that flank the stator 4 at both the axis-direction ends thereof and a plurality of fastening bolts 9 each of which is inserted between the front bracket 7 and the rear bracket 8 and fastens the front bracket 7 and the rear bracket 8 in a direction along which the bracket 7 and the rear bracket 8 approach each other. The front bracket 7 and the rear bracket 8 are formed of metal. In the bottom portion of each of the front bracket 7 and the rear bracket 8, which are approximately bowl-shaped, a plurality of air inlets are formed; similarly, in both the outer-circumference shoulder portions of each of the front bracket 7 and the rear bracket 8, a plurality of air outlets are formed.

The stator 4 has a cylindrical stator iron core 10 that is inserted between the front bracket 7 and the rear bracket 8 and is fastened by the fastening bolt 9 and a stator winding 11, as the armature winding, provided on the stator iron core 10. In Embodiment 1, the stator winding 11 is included in the armature winding of the electric rotating machine 1. The stator winding 11 is configured with two three-phase AC windings that are each formed through star connection.

The rotor 5 has a rotor shaft 12 disposed on the axis line of the rotor 5, a pair of rotor iron cores 13 fixed on the intermediate portion of the rotor shaft 12, and a rotor winding 14, as the magnetic-field winding, enclosed by the iron cores 13. The pair of rotor iron cores 13 configures so-called claw-pole magnetic poles. The pair of rotor iron cores 13 is made of iron; eight claw-shaped magnetic poles are provided in the circumferential direction thereof on the circumferential edge thereof at an equal-angle pitch in such a way as to protrude in the axis direction of the rotor shaft 12; the pair of rotor iron cores 13 is fixed on the rotor shaft 12 in such a way that the claw-shaped magnetic poles are engaged with each other. The rotor winding 14 is enclosed by a pair of magnetic-pole iron cores.

The rotor shaft 12 penetrates the front bracket 7 and the rear bracket 8 and is pivotably supported by a pair of bearings 15 provided in the front bracket 7 and the rear bracket 8. The outer circumference of the rotor iron core 13 faces the inner circumference of the stator 4 through a predetermined gap. A pair of air-blowing cooling fans 16 that are rotated integrally with the rotor 5 is provided at both the axis-direction ends of the rotor iron core 13.

A pulley 17 is fixed at the axis-direction end, of the rotor shaft 12, in the vicinity of the front bracket 7. A communication belt (unillustrated) that works in conjunction with the rotation axle of an internal combustion engine (unillustrated) mounted in the vehicle is wound around the pulley 17; through the communication belt, transmission and reception of the driving power are performed between the electric rotating machine 1 and the internal combustion engine. A rotation-position detection sensor 18 that generates a signal in accordance with the rotation of the rotor shaft 12 and a pair of slip rings 19 electrically connected with the rotor winding 14 are provided in the vicinity of the axis-direction end, of the rotor shaft 12, that is close to the rear bracket 8. These slip rings 19 are each formed of a ring-shaped conductive member that surrounds the outer circumference of the rotor shaft 12.

A pair of brushes 20 formed of a conductive material is held by a brush holder 21 fixed on the rear bracket 8; the brushes are biased by a pair of pressing springs 22 in a direction along which the brushed make contact with the respective slip rings 19. The brush 20 and the slip ring 19 slidably make contact with each other when the rotor 5 rotates; a magnetic-field current is supplied to the stator winding 11 by way of the brush 20 and the slip ring 19.

The control apparatus 3 is provided with two power module composites 23 electrically connected with the stator winding 11, a magnetic-field circuit unit 24 that adjusts DC power from a vehicle battery (unillustrated) as a DC power source and supplies the DC power, as a magnetic-field current, to the rotor winding 14, a control circuit unit 25 that controls the power module composite 23 and the magnetic-field circuit unit 24, and a signal relay unit 26 that performs transmission and reception of control signals among the power module composite 23, the magnetic-field circuit unit 24, and the control circuit unit 25. As describe later, the control apparatus 3 is fixed to the axis-direction end of the rear bracket 8 and is enclosed by a cover 38 formed of an insulating resin. The control circuit unit 25 is provided with a leading-to-outside connector 27 that performs transmission and reception of a signal with an external apparatus (e.g., an internal combustion engine control unit).

The control circuit unit 25 is provided with a control board 251 having a control circuit; the control board 251 is protected by a resin 252. A signal from the rotation-position detection sensor 18 is transmitted to the control circuit unit 25 by way of the signal relay unit 26, and a signal from an external apparatus such as an internal combustion engine control unit is transmitted to the control circuit unit 25 by way of the connector 27. Based on information obtained from the transmitted signals, the control circuit unit 25 performs switching-control of respective switching devices provided in the magnetic-field circuit unit 24 and the power module composite 23.

The magnetic-field circuit unit 24 is configured with electronic components, such as switching device and the like, that are molded by a molding resin; the control circuit unit 25 performs switching control of the switching device so as to adjust the magnetic-field current for the rotor winding 14. A heat sink equipped with a cooling fin 241 is provided in the magnetic-field circuit unit 24. The magnetic-field current that has been adjusted by the magnetic-field circuit unit 24 is supplied to the rotor winding 14, thereby generating a DC magnetic field in the rotor winding 14. The magnetic flux produced by the DC magnetic field generated in the rotor winding 14 flows on the circumference of the rotor 5 in such a way as to depart from one of the rotor iron cores 13 and reach the other one of the rotor cores 13; in the meantime, the magnetic flux is interlinked with the stator winding 11.

Each of the two power module composites 23, configured in the same manner, is provided with an after-mentioned power module 30 including six switching devices that form an electric-power conversion circuit. The electric-power conversion circuit configured with these switching devices operates as an inverter circuit that converts DC power from a battery (unillustrated) into AC power and supplies the AC power to the stator winding 11. Alternatively, the electric-power conversion circuit operates as an inverter circuit that converts AC power from the stator winding 11 into DC power, charges the battery with the DC power, and supplies the DC power to vehicle apparatuses. The switching device 36 included in the electric-power conversion circuit is formed of a semiconductor switching device such as a power transistor, a MOSFET, or an IGBT. The two power module composites 23 form a three-phase electric-power conversion circuit that corresponds in a one-to-one manner to two pairs of armature windings.

The signal relay unit 26 has a signal relay member 28 electrically connected with the power module composite 23 and the magnetic-field circuit unit 24 and a signal relay connection unit 29 that is provided in the signal relay member 28 and is connected with the control circuit unit 25. As described above, transmission and reception of signals among the power module composite 23, the magnetic-field circuit unit 24, and the control circuit unit 25 is performed by way of the signal relay unit 26 configured in such a manner as described above.

Figure 3:
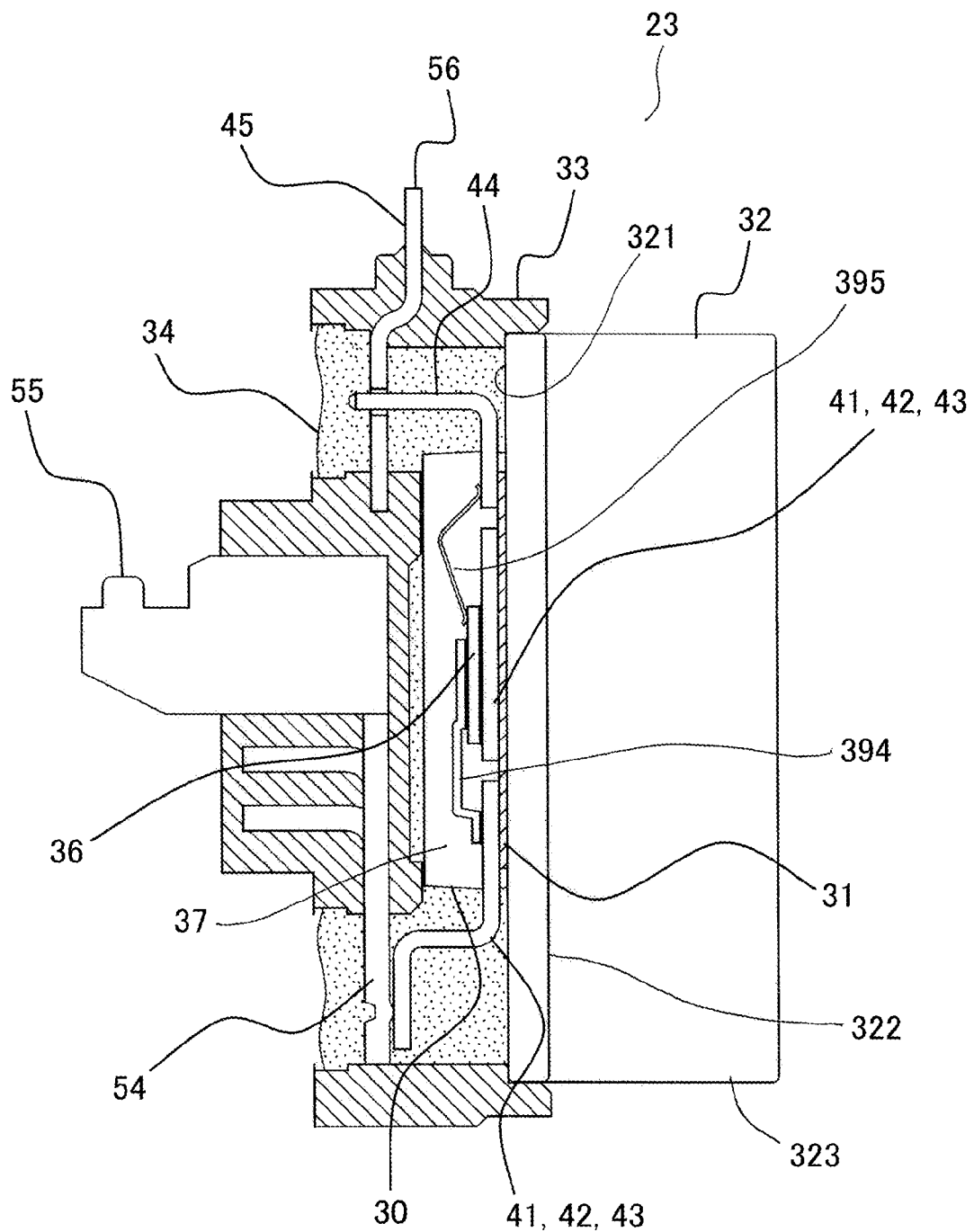
FIG. 3 is a cross-sectional view of a power module composite in the electric rotating machine according to Embodiment 1 of the present invention.
Figure 4:
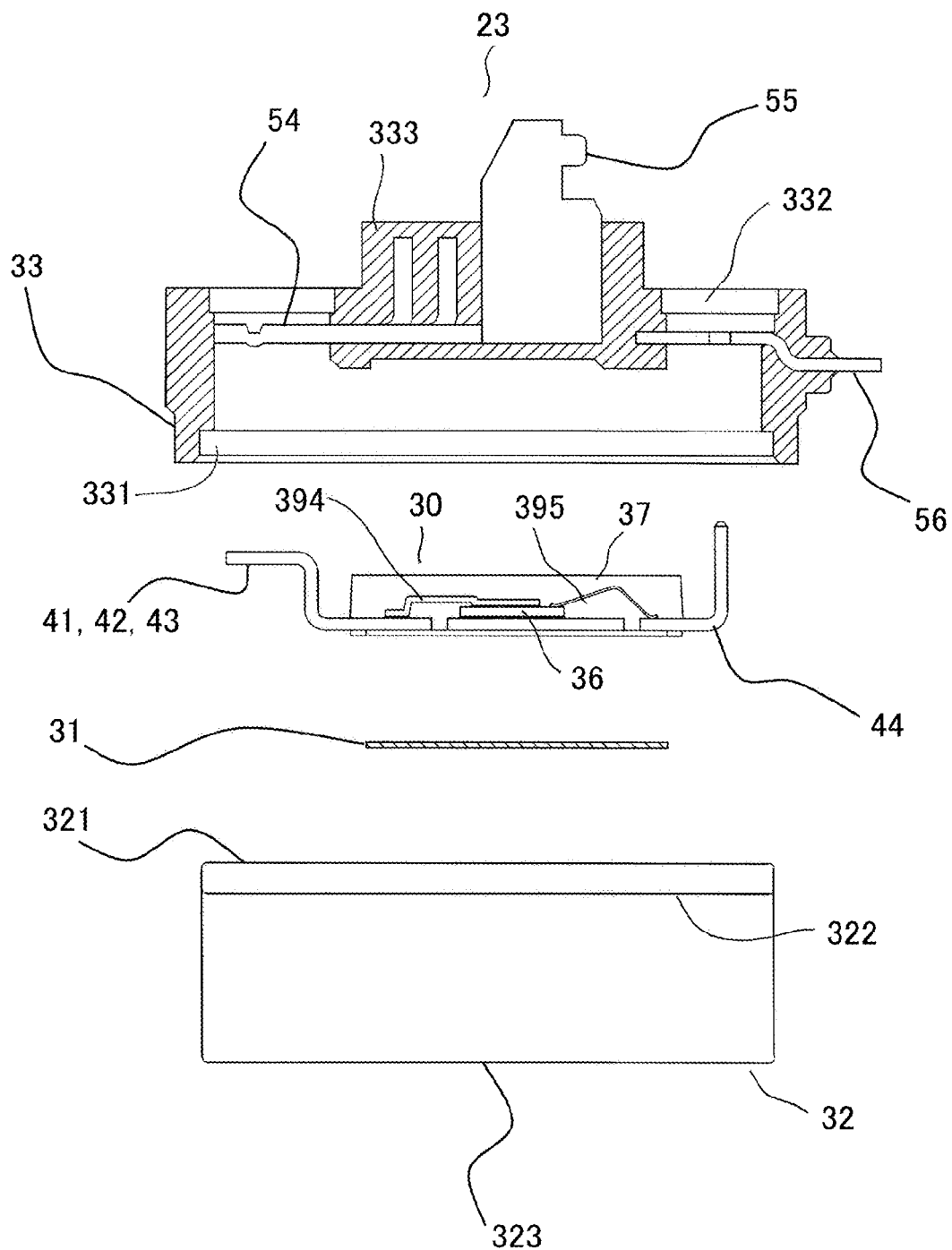
FIG. 4 is a set of decomposed cross-sectional views of a power module composite in the electric rotating machine according to Embodiment 1 of the present invention.

Next, the power module composite 23 will be explained. FIG. 3 is a cross-sectional view of the power module composite in the electric rotating machine according to Embodiment 1 of the present invention; FIG. 4 is a set of decomposed cross-sectional views of the power module composite in the electric rotating machine according to Embodiment 1 of the present invention. In each of FIGS. 3 and 4, the power module composite 23 is configured with the power module 30 configured as described later, a heat sink 32 to which the power module 30 is made to adhere via an insulating material 31, a housing 33, three electric power connection members 54 integrally molded with the housing 33, three AC terminals 55 electrically connected with the respective electric power connection members 54, and a plurality of signal connection members 56.

The housing 33 is formed of an insulating resin and is provided with a first opening portion 331, a second opening portion 332, and a terminal fixing portion 333 in which parts of the foregoing electric power connection member 54, the AC terminal 55, and the signal connection member 56 are fixed through molding.

The heat sink 32 is inserted into the first opening portion 331 in such a way as to close the first opening portion 331 of the housing 33; the peripheral portion thereof is made to adhere by an adhesive to the inner wall portion of the first opening portion 331. The power module 30 placed on a first flat portion 321 of the heat sink 32 is contained in the inner space of the housing 33 and is protected by a protection gel 34 being filled into the inner space and formed of a gel material such as silicon or an epoxy resin. Two or more cooling fins 323 are formed on a second flat portion 322 of the heat sink 32. It is desirable to form the heat sink 32, for example, by drawing an aluminum material.

Figure 5:
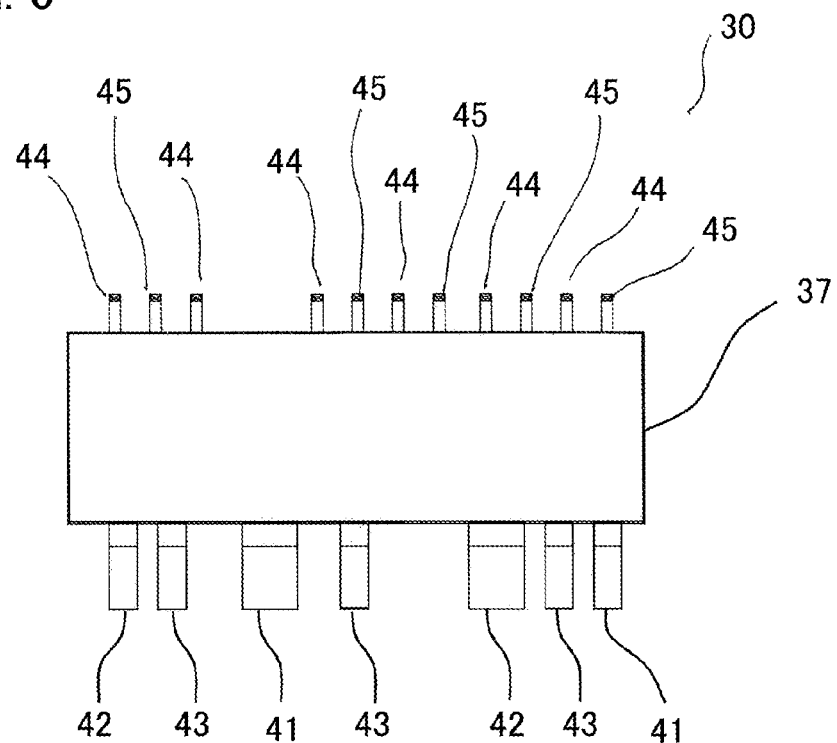
FIG. 5 is a front view of a power module in the electric rotating machine according to Embodiment 1 of the present invention.
Figure 6:
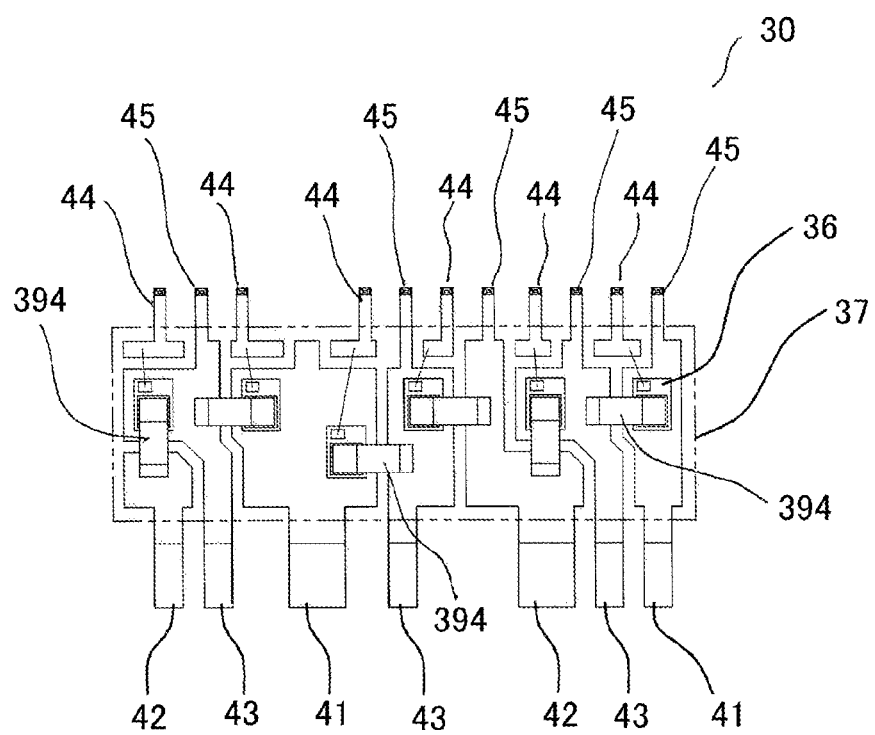
FIG. 6 is an internal configuration view of the power module in the electric rotating machine according to Embodiment 1 of the present invention.

FIG. 5 is a front view of the power module in the electric rotating machine according to Embodiment 1 of the present invention. FIG. 6 is an internal configuration view of the power module in the electric rotating machine according to Embodiment 1 of the present invention. The power module 30 illustrated in each of FIGS. 5 and 6 forms a three-phase bridge circuit as the three-phase electric-power conversion circuit. In each of FIGS. 5 and 6, the power module 30 includes six switching devices 36 that are included in the respective upper arms and lower arms for three phases of the electric-power conversion circuit; two positive-electrode lead frames 41, as first lead frames, that are each connected with the positive electrode, as a first electrode, of the switching device 36, by way of a connecting conductor 394; two negative-electrode lead frames 42, as second lead frames, that are each electrically connected with the negative electrode, as a second electrode, of the switching device 36, by way of the connecting conductor 394; three AC-side lead frames 43 that are each electrically connected with the series connection portion of a pair of switching devices 36 that form the upper arm and the lower arm for each phase, by way of the connecting conductor 394; and six control lead frames 44, as third lead frames, that are each electrically connected with the control electrode, as a third electrode, of the switching device 36, by way of a lead wire 395.

As well illustrated in FIGS. 3, 4, and 6, the lead frames 41, 42, 43, and 44 are arranged on the same plane in such a way as to be spaced apart from one another. The bottom surfaces of the lead frames 41, 42, 43, and 44 are exposed at the bottom surface of the power module.

The two positive-electrode lead frames 41 are connected with the positive-polarity terminal; the two negative-electrode lead frames 42 are connected with the negative-polarity terminal. The three AC-side lead frames 43 are connected with a winding end 111 of the stator winding 11 by way of three respective AC connection portions 54 and three respective AC terminals 55 (refer to FIG. 1).

The power module 30 has five temperature-sensor lead frames 45 connected with temperature sensors (unillustrated) for measuring the temperature of the switching devices 36; as is the case with other constituent elements, the power module 30 is integrally molded with a molding resin 37.

As illustrated in FIG. 6, the two positive-electrode lead frames 41, the two negative-electrode lead frames 42, the three AC-side lead frames 43, the six control lead frames 44, and the five temperature-sensor lead frames 45 are arranged spaced apart from one another. The spaces among these lead frames are filled with the molding resin 37 so that the lead frames are insulated from one another. As described above, the electrodes of the switching devices 36 are electrically connected, through soldering or the like, with the respective corresponding lead frames 41, 42, 43, and 44 and are integrally molded by the molding resin 37 so as to be integrally fixed.

Parts of the six control lead frames 44 and the five temperature-sensor lead frames 45 are pulled out from one side face of the rectangular molding resin 37; as illustrated in FIG. 3 or 4, each of the pulled out portions is bent in an L-shaped manner. Parts of the two positive-electrode lead frames 41, the two negative-electrode lead frames 42, and the three AC-side lead frames 43 are pulled out from the other side face of the molding resin 37; as illustrated in FIG. 3 or 4, each of the pulled out portions is bent in an L-shaped manner.

As illustrated in FIGS. 3 and 4, the lead frames 41, 42, 43, and 44 protrude from the face, of the power module 31, that faces the heat sink 32. The molding resin 37 protrudes toward the heat sink 32 from the lead frames 41, 42, 43, and 44; however, the face, of the molding resin 37, that face the heat sink 32 and the lead frames 41, 42, 43, and 44 may be approximately on the same plane.

The heat sink 32 on the first flat portion 321 of which the power module 30 is adhered by the insulating material 31 is inserted into the first opening portion 331 of the housing 33 so as to adhere to the housing 33. Because the insulating material 31 needs to play not only the role of insulating the heat sink 32 from the power module 30 but also the roles of making the heat sink 32 adhere to the power module 30 and transferring heat between the power module 30 and the heat sink 32; therefore, the insulating material 31 is formed of a material having an adhesion performance and a high-heat conductivity.

As illustrated in FIG. 2, the two power module composites 23 configured as described above, the magnetic-field circuit unit 24, and the control circuit unit 25 are arranged in such a way as to surround the periphery of the rotor shaft 12 and are fixed at the axis-direction end of the rear bracket 6. Each of the two power module composites 23 is fixed to the rear bracket by screws (unillustrated) at a pair of flange portions 51 formed in the housing 33 thereof. The flange portion 51 has a mounting face in a direction perpendicular to the rotor shaft 12; from the rear bracket 8, a screw can fasten the flange portion 51 to the rear bracket.

The two power module composites 23 are arranged in such a way as to surround the bottom half, in FIG. 2, of the rotor shaft 12. A plurality of cooling fins 323 of the heat sink 32 in the power module composite 23 extends perpendicularly toward the rotor shaft 12 from the second flat portion 322 of the heat sink 32.

The magnetic-field circuit unit 24 is disposed in such a way as to close the upper half, in FIG. 2, of the rotor shaft 12 and is fixed by bolts (unillustrated) to the rear bracket 6 through a pair of flange portions 241 provided in the magnetic-field circuit unit 24. Cooling fins 242 of the heat sink provided in the magnetic-field circuit unit 24 extend perpendicularly toward the rotor shaft 12.

The control circuit unit 25 is disposed at a more outer side than the magnetic-field circuit unit 24 in the radial direction of the electric rotating machine 1 and is situated in such a way that the longitudinal direction thereof is along the magnetic-field circuit unit 24.

In the electric rotating machine 1, because the temperature of the stator 4 becomes high during its operation, the temperature of the rear bracket 8 adjoining the stator 4 rises due to transfer of heat from the stator 4; thus, due to the transfer of heat from the stator 4, the temperatures of the components and the like adjoining the rear bracket 8 also rise. In Embodiment 1 of the present invention, the power module composite 23 is fixed to the rear bracket 8 by use of the flange portion 51 of the housing 33; although the power module composite 23 and the rear bracket 8 make contact with each other via the flange portion 51, the heat sink 32 and the rear bracket 8 do not make contact directly with each other. Because the thermal resistance between the power module composite 23 and the heat sink 32 is large and the heat sink 32 and the rear bracket 8 do not make contact directly with each other, heat transferred to the heat sink 32 is reduced.

As described above, in the electric rotating machine according to Embodiment 1 of the present invention, the power module composite 23 is fixed to the rear bracket 8 by use of the flange portion 51 of the housing 33; therefore, because the direct heat transfer path from the stator whose temperature becomes high to the heat sink 32 through the rear bracket 8 can be eliminated, the temperature hike in the heat sink 32 can be reduced. Moreover, because the temperature hike of the heat sink 32 is eliminated, the temperature rise in the switching device 36 of the power module 30 fixed to the heat sink 32 via the insulating material 31 can be reduced.

In the electric rotating machine according to Embodiment 1 of the present invention, the control circuit unit 25 performs switching control of the switching devices in the power module composite 23 and the switching devices in the magnetic-field circuit unit 24, based on, as described above, respective information items from the rotation-position detection sensor 18 and the external apparatus.

That is to say, when the internal combustion engine is started, DC electric power from the battery is supplied to the power module composite 23 and the magnetic-field circuit unit 24. The magnetic-field circuit unit 24 converts the DC electric power from the battery into a magnetic-field current, based on the switching control of the switching devices and the like by the control circuit unit 25. The magnetic-field current from the magnetic-field circuit unit 24 is supplied to the rotor winding 14 by way of the brush 20 and the slip ring 19; as a result, a DC magnetic field is generated in the rotor 5.

In contrast, the electric-power conversion circuit provided in the power module composite 23 works as an inverter, based on the switching control of the switching devices 36 by the control circuit unit 25; the electric-power conversion circuit inverts DC electric power into AC electric power and supplies the AC electric power to the stator winding 11. As a result, a rotating magnetic field is generated in the stator 4 and the rotor 5 rotates so as to start the internal combustion engine through the pulley 17 and the communication belt.

After the internal combustion engine has been started, the rotation power from the internal combustion engine is transferred to the pulley 17 through the communication belt. As a result, the rotor 5 is rotated and AC electric power is induced across the stator winding 11. In this situation, the electric-power conversion circuit in the power module composite 23 works as a converter, based on the switching control of the switching devices 36 by the control circuit unit 25; the electric-power conversion circuit converts the AC electric power induced across the stator winding 11 into DC electric power so as to charge the battery with the DC electric power and to supply the DC electric power to the vehicle electronic devices, as may be necessary.

Embodiment 2

In an electric rotating machine according to Embodiment 2 of the present invention, as the insulating material 31 utilized for making the power module 30 and the heat sink 32 adhere to each other, a silicon-based adhesive is utilized. The other configurations are the same as those in Embodiment 1.

In general, the value of the voltage utilized in the electric rotating machine 1 that is mounted in an automobile and utilized does not exceed 100 [V]. Accordingly, when the thickness of the insulating material 31 is as large as 20 [μm], the insulation between the power module 30 and the heat sink 32 can be secured. Therefore, even when as the insulating material 31, a silicon-based adhesive or the like is utilized, the withstand voltage can be secured without utilizing an expensive material such as an insulation sheet.

The space in the vicinity of the internal combustion engine in which the electric rotating machine 1 is mounted becomes high-temperature; therefore, when the lead frames 41, 42, 43, and 44 of the power module 30 are formed of copper or copper alloy and the heat sink 32 is formed of aluminum, thermal stress is applied to the insulating material 31 as the temperature of the power module 30 rises, because there exists the difference between the linear expansion coefficient of copper, which is $17 \times 10^{-6}$ ($1/°$ C.) and the linear expansion coefficient of aluminum, which is $24 \times 10^{-6}$ ($1/°$ C.). However, a silicon-based material utilized as the insulating material 31 has a lower elastic modulus and expands more largely than an epoxy-based material (e.g., an insulating sheet); thus, the adverse effect of the thermal stress can be reduced.

In Embodiment 2, because as the insulating material 31, a silicon-based adhesive is utilized, a material whose elastic modulus is low and that expands well is obtained; thus, the adverse effect of the thermal stress can be reduced.

In the electric rotating machine according to any one of Embodiments 1 and 2 of the present invention, two or more pairs of upper and lower arms among the upper and lower arms included in the electric-power conversion circuit are integrated in a single power module, so that the power wiring leads of the lead frames can be commonly utilized; thus, the semiconductor module can be downsized.

The power module is provided with two or more pairs of switching devices included in the upper and lower arms of the electric-power conversion circuit and hence the lead frames having the electric potentials corresponding to the respective arms of the electric-power conversion circuit are exposed at the bottom face of the power module; however, because the power module is made to adhere to the heat sink through an insulating material, the heat sink has no electric potential and hence measures for electrolytic corrosion and the distance necessary for insulation from other components can be reduced; the degree of flexibility in the shape and the disposal of the heat sink can be raised.

Moreover, when two or more arms in the electric-power conversion circuit are modularized into a single power module, the number of modules to be fixed to the bracket can be decreased, in comparison with the case where the two or more arms are separately modularized; therefore, the number of man-hours during production is reduced.

Because the power module composite provided with the power module is fixed to the bracket through the flange, the heat transfer paths from the stator to the heat sink can be reduced; therefore, the temperature hike of the power module, especially the switching device thereof, can be reduced.

The insulating material for making the power module adhere to the heat sink is formed of a low-elastic-modulus material such as a silicon-based material, so that the insulating material has a lower elastic modulus and expands more largely than an epoxy-based material such as an insulating sheet. As a result, the adverse effect of thermal stress between the lead frame and the heat sink, which is applied to the insulating material, can be absorbed; thus, the long-term reliability can be raised.

The electric rotating machine according to any one of Embodiments 1 and 2 of the present invention, described heretofore, are characterized as follows.

1. An electric rotating machine includes a rotor fixed on the rotor shaft, a stator that is disposed in such a way as to face the rotor and is provided with a stator winding, a case that pivotably supports the rotor shaft and holds the stator, and a control apparatus that is fixed to the case and has a power module composite provided with an electric-power conversion circuit that performs electric-power conversion between the stator winding and an external DC power source and a control apparatus having a control circuit unit that controls the electric-power conversion circuit; the electric rotating machine is characterized in that the electric-power conversion circuit provided in the power module composite is controlled by the control circuit unit so as to convert DC power from an external DC power source into AC power and supply the AC power to the stator winding or so as to convert AC power generated across the stator winding into DC power and supply the DC power to the DC power source, in that the power module composite includes a power module provided with switching devices included in the electric-power conversion circuit, a housing containing the power module, and a heat sink that is fixed to the housing and refrigerates the power module, in that the power module includes a first lead frame connected with a first electrode of the switching device, a second lead frame connected with a second electrode of the switching device, a third lead frame connected with a third electrode of the switching device, and a molding resin for integrally molding the first lead frame, the second lead frame, and the third lead frame and for insulating the first lead frame, the second lead frame, and the third lead frame from one another, and in that the heat sink adheres to the power module via an insulating material.

The foregoing configuration makes it possible to obtain an electric rotating machine provided with a high-reliability control apparatus that can readily be assembled and does not require conventional measures for electrolytic corrosion of the heat sink.

(2) The electric rotating machine is characterized in that the power module composite is mounted in the electric rotating machine when the housing is fixed to the case.

The foregoing configuration makes it possible to reduce the heat transfer paths from the stator to the heat sink; thus, the temperature of the power module, especially, the temperature of the switching device can be lowered.

(3) The electric rotating machine is characterized in that the first lead frame, the second lead frame, and the third lead frame integrally molded by use of the molding resin are arranged on the same plane.

The foregoing configuration makes the arrangement of the lead frames easy; thus, the lead frames can readily be insulated from one another. Moreover, the thickness of the power module can be decreased.

(4) The electric rotating machine is characterized in that the first lead frame and the second lead frame are pulled out from one side face of the molding resin to the outside of the molding resin and in that the third lead frame is pulled out from the other side face, of the molding resin, that is opposite to the one side face, to the outside of the molding resin.

Because the foregoing configuration makes it possible to collect the power wiring leads of the power module composite at a proximal side of the electric rotating machine main body and to collect the signal wiring leads at a distal side thereof, materials having respective different thicknesses can be utilized at the proximal and distal sides of the electric rotating machine main body; therefore, the working efficiency in mounting the housing of the power module composite onto the case of the electric rotating machine can be raised.

(5) The electric rotating machine is characterized in that the housing of the power module composite is provided with an inner space having an opening portion, in that the power module made to adhere to the heat sink is inserted into the inner space of the housing, in that the heat sink is made to adhere to the housing in such a way as to close the opening portion of the housing, and in that the inner space of the housing, into which the power module is inserted, is filled with a resin.

The foregoing configuration makes it possible to form the power module composite in a compact and robust manner.

(6) The electric rotating machine is characterized in that the stator winding is formed of a three-phase armature winding, in that the electric-power conversion circuit is formed of a three-phase bridge circuit, in that the respective switching devices are connected with upper and lower arms for each corresponding phase of the three-phase bridge circuit, and in that all the switching devices of the three-phase bridge circuit are integrated in the power module.

The foregoing configuration makes it possible to reduce the power terminals of the power module and hence achieve downsizing and reduction of the mounting area.

(7) The electric rotating machine is characterized in that the insulating material is formed of a material having a low elastic modulus.

Therefore, when the insulating material is formed of a low-elastic-modulus material such as a silicon-based material, the insulating material has a lower elastic modulus and expands more largely than an epoxy-based material (such as an insulating sheet). As a result, the adverse effect of thermal stress between the lead frame and the heat sink, which is applied to the insulating material, can be absorbed; thus, the long-term reliability can be raised (8) The electric rotating machine is characterized by further including a magnetic-field winding fixed on the rotor and a magnetic-field circuit unit including switching devices and is characterized in that the control circuit unit performs switching control of the switching devices so that the magnetic-field circuit unit controls a magnetic-field current flowing in the magnetic-field winding.

Accordingly, when the electric rotating machine is a motor provided with a brush, the stator and the rotor can be downsized, provided the performance is the same.

(9) The electric rotating machine is characterized in that the switching devices of the magnetic-field circuit unit are molded by use of a molding resin.

The foregoing configuration makes it possible to reduce heat that is transferred from the stator to the magnetic-field circuit unit.

In Embodiments 1 and 2, a vehicle AC motor generator has been explained; however, the present invention is not limited thereto. In general, due to a severe usage environment, a strict vibration resistance of a vehicle electric rotating machine such as a vehicle AC generator is required, and in terms of the layout inside the engine room, the downsizing of the vehicle electric rotating machine is also strongly required; thus, the present invention can be applied to both the vehicle electric rotating machines. The present invention demonstrates the same effect even when applied to a rotating electric machine such as an AC motor generator or an AC generator for other applications.

INDUSTRIAL APPLICABILITY

The present invention can be applied to the field of an electric rotating machine, especially to the field of an electric rotating machine such as a motor generator, mounted in an automobile or the like, that starts an internal combustion engine or is driven by the internal combustion engine so as to generate electricity.

DESCRIPTION OF REFERENCE NUMERALS

1: electric rotating machine
2: electric rotating machine main body

3: control apparatus
4: stator
5: rotor
6: case
7: front bracket
8: rear bracket
9: fastening bolt
10: stator iron core
11: stator winding
111: winding end of stator winding
12: rotor shaft
13: rotor iron core
14: rotor winding
15: bearing
16: cooling fan
17: pulley
18: rotation-position detection sensor
19: slip ring
20: brush
21: brush holder
22: pressing spring
23: power module composite
30: power module
31: insulating material
32: heat sink
323, 242: cooling fin
33: housing
36: switching device
37: molding resin
394: connecting conductor
395: lead wire
41: positive-electrode lead frame
42: negative-electrode lead frame
43: AC-side lead frames
44: control lead frame
45: temperature-sensor lead frame
54: AC connection portion
55: AC terminal
51, 241: flange portion

The invention claimed is:

1. An electric rotating machine comprising:
a rotor fixed on a rotor shaft;
a stator that is disposed in such a way as to face the rotor and is provided with a stator winding;
a case that pivotably supports the rotor shaft and holds the stator; and
a control apparatus that is fixed to the case and has a power module composite provided with an electric-power conversion circuit that performs electric-power conversion between the stator winding and an external DC power source and the control apparatus having a control circuit unit that controls the electric-power conversion circuit,
wherein the electric-power conversion circuit provided in the power module composite is controlled by the control circuit unit so as to convert DC power from an external DC power source into AC power and supply the AC power to the stator winding or so as to convert AC power generated across the stator winding into DC power and supply the DC power to the DC power source,
wherein the power module composite includes a power module provided with switching devices included in the electric-power conversion circuit, a housing containing the power module, and a heat sink that is fixed to the housing and refrigerates the power module,
wherein the power module includes a first lead frame connected with a first electrode of at least one of the switching devices, a second lead frame connected with a second electrode of at least one of the switching devices, a third lead frame connected with a third electrode of at least one of the switching devices, and a molding resin for integrally molding the first lead frame, the second lead frame, and the third lead frame and for insulating the first lead frame, the second lead frame, and the third lead frame from one another,
wherein the heat sink adheres to the power module via an insulating material,
wherein the first lead frame and the second lead frame both protrude from one side face of the molding resin to the outside of the molding resin,
wherein the third lead frame protrudes from an other side face of the molding resin to the outside of the molding resin, and
wherein the one side face is provided along a first plane and the other side face is provide along a second plane different from the first plane.

2. The electric rotating machine according to claim 1, wherein the power module composite is mounted in the electric rotating machine when the housing is fixed to the case.

3. The electric rotating machine according to claim 1, wherein the first lead frame, the second lead frame, and the third lead frame integrally molded by use of the molding resin are arranged on the same plane in such a way as to be spaced apart from one another.

4. The electric rotating machine according to claim 1,
wherein the housing of the power module composite is provided with an inner space having an opening portion,
wherein the power module made to adhere to the heat sink is inserted into the inner space of the housing,
wherein the heat sink is made to adhere to the housing in such a way as to close the opening portion of the housing, and
wherein the inner space of the housing, into which the power module is inserted, is filled with a resin.

5. The electric rotating machine according to claim 1,
wherein the stator winding is formed of a three-phase armature winding,
wherein the electric-power conversion circuit is formed of a three-phase bridge circuit,
wherein the respective switching devices are connected with upper and lower arms for each corresponding phase of the three-phase bridge circuit, and
wherein all the switching devices of the three-phase bridge circuit are integrated in the power module.

6. The electric rotating machine according to claim 1, wherein the insulating material is a silicon-based material.

7. The electric rotating machine according to claim 1, further including a magnetic-field winding fixed on the rotor and a magnetic-field circuit unit including switching devices, wherein the control circuit unit performs switching control of the switching devices so that the magnetic-field circuit unit controls a magnetic-field current flowing in the magnetic-field winding.

8. The electric rotating machine according to claim 1, wherein the switching devices of the magnetic-field circuit unit are molded by use of a molding resin.

9. The electric rotating machine according to claim 1, wherein the first plane and the second plane are oriented parallel to one another.

10. The electric rotating machine according to claim 1, wherein the first lead frame and the second lead frame both protrude from the one side face in a first direction, and
wherein the third lead frame protrudes from the other side face in a second direction different the first direction.

11. The electric rotating machine according to claim 10, wherein the first direction and the second direction are opposite to one another.

\* \* \* \* \*